United States Patent
Rao et al.

(10) Patent No.: US 6,208,549 B1
(45) Date of Patent: Mar. 27, 2001

(54) ONE-TIME PROGRAMMABLE POLY-FUSE CIRCUIT FOR IMPLEMENTING NON-VOLATILE FUNCTIONS IN A STANDARD SUB 0.35 MICRON CMOS

(75) Inventors: Kameswara K. Rao, San Jose; Martin L. Voogel, Santa Clara, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/513,235

(22) Filed: Feb. 24, 2000

(51) Int. Cl.$^7$ .................................................. G11C 17/00
(52) U.S. Cl. ..................... 365/96; 365/225.7; 365/208; 327/525
(58) Field of Search .............................. 365/96, 103, 104, 365/148, 225.7, 207, 208; 327/525

(56) References Cited

U.S. PATENT DOCUMENTS

| | | | |
|---|---|---|---|
| 5,066,998 | 11/1991 | Fischer et al. | 357/51 |
| 5,708,291 | 1/1998 | Bohr et al. | 257/529 |
| 5,812,477 | * 9/1998 | Casper et al. | 365/225.7 |
| 5,844,298 | * 12/1998 | Smith et al. | 365/96 |
| 5,936,880 | * 8/1999 | Payne | 365/148 |
| 5,999,038 | * 12/1999 | Pathak et al. | 327/525 |

OTHER PUBLICATIONS

Jerome B. Lasky, James S. Nakos, Orison J. Cain, and Peter J. Geiss, "Comparison of Transformation to Low–Resistivity Phase and Agglomeration of TiSi$_2$ and CoSi$_2$", IEEE Transactions on Electron Devices, vol. 38, No. 2, Feb. 1991, pp. 262–269.

Mohsen Alavi, Mark Bohr, Jeff Hicks, Martin Denham, Allen Cassens, Dave Douglas, Min–Chun Tsai, "A PROM Element Based on Salicide Agglomeration of Poly Fuses in a CMOS Logic Process", IEEE 1977, pp. 34.3.1–34.3.4.

* cited by examiner

Primary Examiner—Son Mai
(74) Attorney, Agent, or Firm—Bever, Hoffman & Harms, LLP; E. Eric Hoffman; Lois D. Cartier

(57) ABSTRACT

A memory system is provided for accessing an array of polycide fuses. The memory system includes an access control circuit configured to individually program and read each of the polycide fuses in the array. Row and column decoding circuitry is provided to selectively connect one of the polycide fuses to the access control circuit in response to an address signal. In one embodiment, the access control circuit includes a partial sense amplifier circuit, which is completed by connecting one of the polycide fuses to the partial sense amplifier circuit. The completed sense amplifier circuit compares the resistance of the connected polycide fuse with a reference resistance to determine the state of the polycide fuse. The completed sense amplifier circuit provides an output signal representative of the state of the connected polycide fuse. The access control circuit also includes a programming transistor connected between an input/output supply voltage ($V_{IO}$) and the partial sense amplifier circuit. The $V_{IO}$ supply voltage is greater than the $V_{DD}$ supply voltage. When the programming transistor is turned on, the $V_{IO}$ supply voltage is applied to the connected polycide fuse. Under these conditions, the resistance of the connected polycide fuse significantly increases, thereby programming the polycide fuse.

19 Claims, 5 Drawing Sheets

ONE-TIME PROGRAMMABLE POLY-FUSE CIRCUIT FOR IMPLEMENTING NON-VOLATILE FUNCTIONS IN A STANDARD SUB 0.35 MICRON CMOS

BACKGROUND OF THE INVENTION

1. Field of the Invention

The present invention relates to integrated circuits, and more specifically to a polycide fuse memory array architecture for standard sub 0.35 micron processes.

2. Description of the Related Art

Most integrated circuits ("chips") now in use are fabricated in what is called CMOS (complementary metal oxide semiconductor) technology, which forms both PMOS and NMOS transistors in a silicon substrate. One of the main objectives of integrated circuit technology is to minimize transistor size. Typically, transistors are described in terms of their minimum feature dimension. Current technology provides a minimum feature size of 0.35 μm or less. The minimum feature size, which is also referred to as a "line width", refers to the minimum width of a transistor feature such as the gate width, or the separation between source and drain diffusions. Typically, 0.35 μm technology is used to form CMOS transistors having a gate oxide thickness of 70 Å. A 0.18 μm technology is used to form CMOS transistors having a gate oxide thickness of 40 Å. The gate "oxide", actually a silicon dioxide layer, is the electrically insulating (dielectric) layer interposed between the conductive gate electrode, which is typically a polycrystalline silicon structure formed overlying the principal surface of the silicon substrate in which the integrated circuit is formed, and the underlying silicon which typically is the channel portion of the transistor extending between the source and drain regions. Transistors of 0.35 μm size typically operate at a voltage of 3.3 Volts. Transistors of 0.18 μm size typically operate at a voltage of 1.8 Volts. Greater voltages are likely to destroy the transistor by rupturing the gate oxide.

A chip fabricated using a 0.18 micron process typically includes core circuitry having transistors of a 0.18 micron size, and input/output circuitry having transistors of a 0.35 micron size. Consequently, 1.8 Volts is used to run the core circuitry of the chip, and 3.3 Volts is used to run the input/output circuitry of the chip. Such a configuration facilitates interfacing the chip to other 3.3 Volt chips. The voltage used to run the input/output circuitry of the chip is designated as the input/output supply voltage, $V_{IO}$.

In the field of data storage, there are two main types of storage elements. The first type is a volatile storage element such as typically used in DRAM (dynamic random access memory) or SRAM (static random access memory) in which the information stored in a particular storage element is lost the instant that power is removed from the circuit. The second type is a non-volatile storage element in which the information is preserved even if power is removed. Typically, the types of devices used to provide non-volatile storage are substantially different from those used in ordinary logic circuitry or in volatile storage, thereby requiring different fabrication techniques.

Non-volatile fuse elements have been fabricated using a standard CMOS process. Non-volatile fuse elements are described in U.S. Pat. No. 5,708,291 to Bohr et al., U.S. Pat. No. 5,066,998 to Fischer et al., "Comparison of Transformation to Low-Resistivity Phase and Agglomeration of $TiSi_2$ and $CoSi_2$," by Lasky et al, IEEE Transactions on Electron Devices, pp. 262–269, Vol. 38, No. 2, February 1991, and "A PROM Element Based on Salicide Agglomeration of Poly Fuses in a CMOS Logic Process" by Alavi et al., IEDM 1997, pp. 855–858. However, these references fail to teach an adequate method of using these fuse elements in an array.

It would therefore be desirable to provide an array of non-volatile fuse elements on an integrated circuit chip formed exclusively using a standard CMOS processes.

SUMMARY

Accordingly, the present invention provides a non-volatile fuse-based memory array, which is fabricated using a standard sub 0.35 micron CMOS process. In one embodiment, the non-volatile memory circuit is fabricated using a standard 0.18 micron CMOS process. The core transistors fabricated in accordance with the 0.18 micron μm CMOS process have a gate oxide thickness of 40 Å, and are designed to operate in response to a nominal supply voltage of 1.8 Volts. The 0.18 micron CMOS process also provides for the fabrication of high voltage CMOS transistors that have a gate oxide thickness of 70 Å. These high voltage CMOS transistors are typically used in the input/output (I/O) circuitry of the integrated circuit chip.

The non-volatile memory array of the present invention includes a non-volatile memory cell that uses a polycide fuse as the storage device. The polycide fuse (i.e., polycide resistor) is fabricated using a sub 0.35 micron CMOS process. The polycide fuse includes a polysilicon structure having a width equal to the width of a gate electrode in the sub 0.35 micron process (i.e., a gate of the standard CMOS process). A thin layer of titanium silicide is formed over the polysilicon structure to reduce the resistance of the resulting polycide fuse structure. An access control circuit is provided to pass a high current of approximately 5 mA through the polycide resistor, thereby heating the titanium silicide to a level, which causes the polycide fuse to become discontinuous. After programming, the resistance of the polycide fuse is increased by about one order of magnitude. The access control circuit is operated in response to both the $V_{IO}$ supply voltage and the $V_{DD}$ supply voltage.

The state of the polysilicon resistor is read through the access control circuit by comparing the resistance of the polycide fuse with a known, predetermined resistance. In one embodiment, the predetermined resistance has a value greater than the resistance of the unprogrammed polycide fuse, and less than the resistance of the programmed polycide fuse.

The present invention also includes a structure for accessing an array of polycide fuses. This structure includes a single access control circuit configured to individually program and read each of the polycide fuses in the array. Row and column decoding circuits are provided to selectively connect one of the polycide fuses to the access control circuit in response to an address signal. In one embodiment, the access control circuit includes a partial sense amplifier circuit. This partial sense amplifier circuit is completed when the row and column decoding circuits connect one of the polycide fuses to the partial sense amplifier circuit. The completed sense amplifier circuit compares the resistance of the connected polycide fuse with a reference resistance to determine the state of the polycide fuse. The completed sense amplifier circuit provides an output signal representative of the state of the connected polycide fuse.

The access control circuit also includes a high-voltage programming transistor connected between the $V_{IO}$ supply terminal and the partial sense amplifier circuit. When the programming transistor is turned on, the $V_{IO}$ supply voltage is applied to the connected polycide fuse. Under these conditions, the connected polycide fuse is programmed.

The present invention will be more fully understood in view of the following description and drawings.

DETAILED DESCRIPTION

Figure 1:
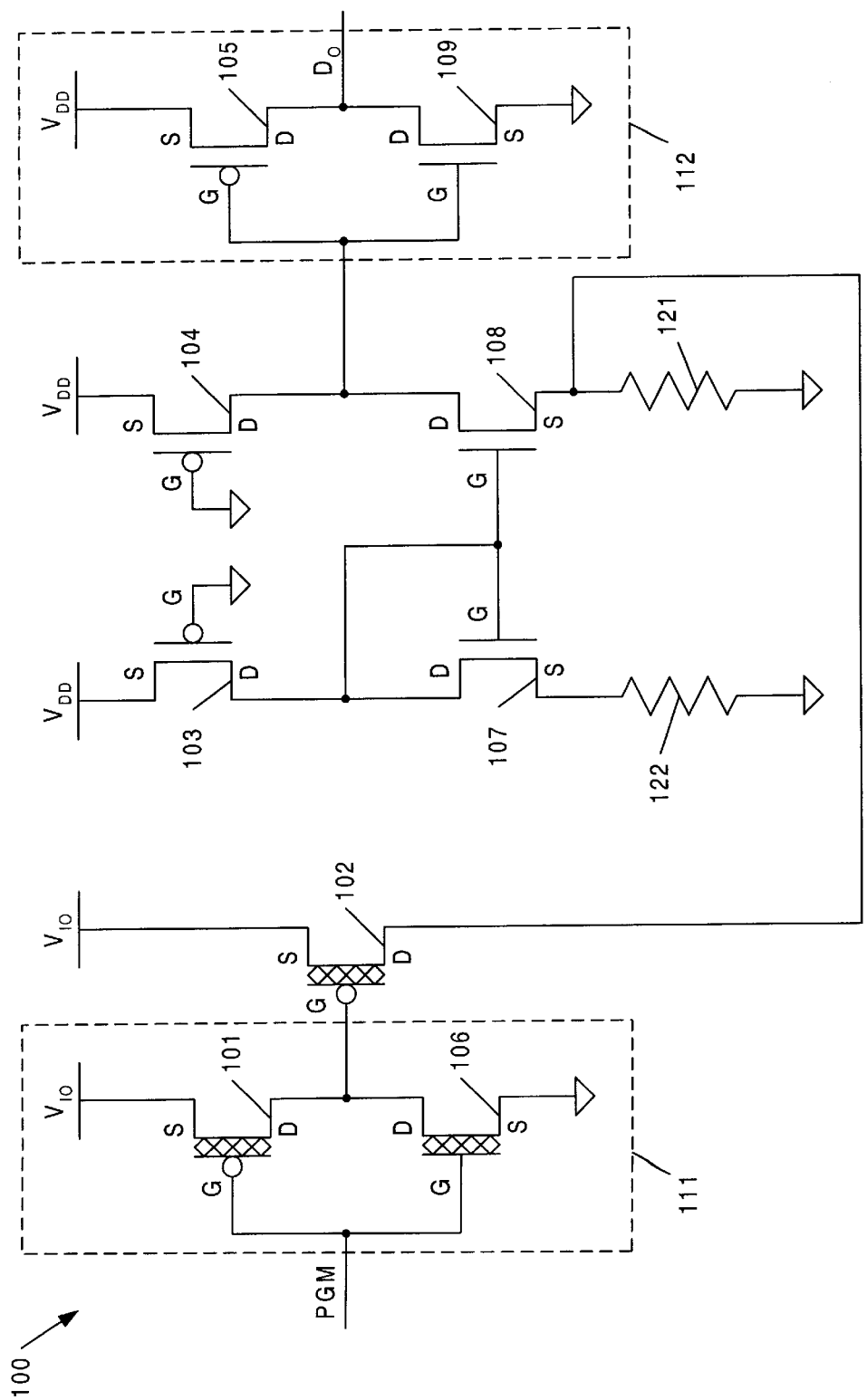
FIG. 1 is a circuit diagram of a one-time programmable polycide fuse with associated access circuitry in accordance with one embodiment of the present invention.

FIG. 1 is a schematic diagram of a non-volatile memory circuit 100 in accordance with one embodiment of this invention. Memory circuit 100 can be located on an integrated circuit chip with other circuitry, which is not shown in FIG. 1. This other circuitry can include, for example, circuitry relating to a field programmable gate array (FPGA). Memory circuit 100 is fabricated in accordance with a sub-0.35 μm technology.

In the described embodiment, memory circuit 100 is fabricated on an integrated circuit chip in accordance with a 0.18 μm CMOS process. The core transistors fabricated in accordance with the 0.18 μm CMOS process typically have a gate oxide thickness of 40 Å, and are designed to operate in response to a nominal supply voltage of 1.8 Volts. These transistors are hereinafter referred to as low voltage CMOS transistors.

The 0.18 μm CMOS process also provides for the fabrication of high voltage CMOS transistors that have a gate oxide thickness of 70 Å, and are designed to operate in response to a nominal supply voltage of 3.3 Volts. These high voltage CMOS transistors are typically used in the input/output (I/O) circuitry of the integrated circuit chip. This I/O circuitry provides an interface between the low voltage CMOS transistors, which form the core of the integrated circuit chip, and an external 3.3 Volt bus.

Memory circuit 100 includes p-channel CMOS transistors 101–105, n-channel CMOS transistors 105–109 and polycide resistors 121–122. P-channel transistors 101 and 102 and n-channel transistor 106 are high voltage CMOS transistors (as indicated by the cross-hatching at the gate oxides of these transistors in FIG. 1). The other transistors 103–104 and 105–107 are low voltage CMOS transistors.

Transistors 101 and 106 are connected to form a high-voltage inverter 111 that is powered by the input/output voltage $V_{IO}$. In the described embodiment, $V_{IO}$ has a nominal value of 3.3 Volts. The input terminal of the inverter 111 is coupled to receive a program control signal (PGM). The output terminal of inverter 111 is coupled to drive the gate of high voltage p-channel transistor 102. P-channel transistor 102 is connected in series between the $V_{IO}$ supply terminal and a first terminal of polycide resistor 121.

In the described embodiment, polycide resistor 122 has a resistance of 200 ohms, and polycide resistor (fuse) 121 has a resistance of 100 ohms. Each of these polycide resistors 121–122 is formed from a narrow line of conductively doped polycrystalline silicon. A thin layer of titanium silicide is formed over the conductively doped polysilicon structure to form polycide resistors 121–122. The line width of polycide resistors 121–122 corresponds with the width of the gate electrodes formed by the CMOS process. Thus, polycide resistors 121–122 have a width of about 0.18 microns in the described embodiment.

P-channel transistor 103, n-channel transistor 107 and resistor 122 are connected in series between the $V_{DD}$ supply terminal (1.8 Volts) and the $V_{ss}$ supply terminal (ground). Similarly, p-channel transistor 104, n-channel transistor 108 and resistor 121 are connected in series between the $V_{DD}$ supply terminal and the $V_{ss}$ supply terminal. P-channel transistors 103 and 104 have the same size. Similarly, n-channel transistors 107 and 108 have the same size. The gates of p-channel transistors 103 and 104 are coupled to the $V_{ss}$ supply terminal. The drain of p-channel transistor 103 is coupled to the gates of n-channel transistors 107 and 108, thereby biasing transistors 1087 and 108 in the same manner. As a result, transistors 103–104, 107–108 and polycide resistors 121–122 are connected to form a sense amplifier circuit.

Transistors 105 and 109 are connected to form a low-voltage inverter 112. The drains p-channel transistor 104 and n-channel transistor 108 are commonly connected to the input terminal of inverter 112. The output terminal of inverter 112 provides the output data value $D_o$ of memory circuit 100.

Memory circuit 100 operates as follows. Initially, polycide resistor 121 is in an undamaged, intact state. At this time, memory circuit 100 is in an unprogrammed state. To remain in the unprogrammed state, the PGM signal is held at a logic low value. Under these conditions, high voltage p-channel transistor 101 turns on, thereby applying the VIO supply voltage to the gate of p-channel transistor 102. The $V_{IO}$ supply voltage turns off p-channel transistor 102, thereby preventing the $V_{IO}$ supply voltage from being applied to polycide resistor 121.

The configuration of p-channel transistor 103, n-channel transistor 107 and polycide resistor 122 causes a constant reference current $I_{REF}$ to flow through these series-connected elements. The relatively low resistance of the unprogrammed polycide resistor 121 (i.e., 100 ohms) results in a relatively low voltage drop across this resistor 121. As a result, a logic low voltage is applied to the input terminal of inverter 112. Thus, inverter 112 provides a logic high output signal Do when memory circuit 100 is in the unprogrammed state.

To program memory circuit 100, the PGM signal is asserted high. Under these conditions, n-channel transistor 106 turns on, thereby applying the $V_{ss}$ supply voltage to the gate of p-channel transistor 102. As a result, p-channel transistor 102 turns on, thereby applying the $V_{IO}$ supply voltage to the first terminal of polycide resistor 121. The device size of p-channel transistor 102 is selected such that approximately 5 mA flows through polycide resistor 121 under these conditions. In response, the titanium silicide layer in polycide resistor 121 heats up and becomes discontinuous, thereby increasing the resistance of polycide resistor 121 to more than 1000 ohms. Polycide resistor 121 therefore operates as a fuse.

After polycide fuse 121 has been programmed, the reference current IREF will cause a relatively large voltage drop across polycide fuse 121. As a result, a logic high voltage is applied to the input terminal of inverter 112. Thus, inverter 112 provides a logic low output signal D0 when memory circuit 100 is in the programmed state. Note that polycide fuse 121 is a one-time programmable device. That is, once polycide fuse 121 is programmed, it cannot be unprogrammed.

Figure 2:
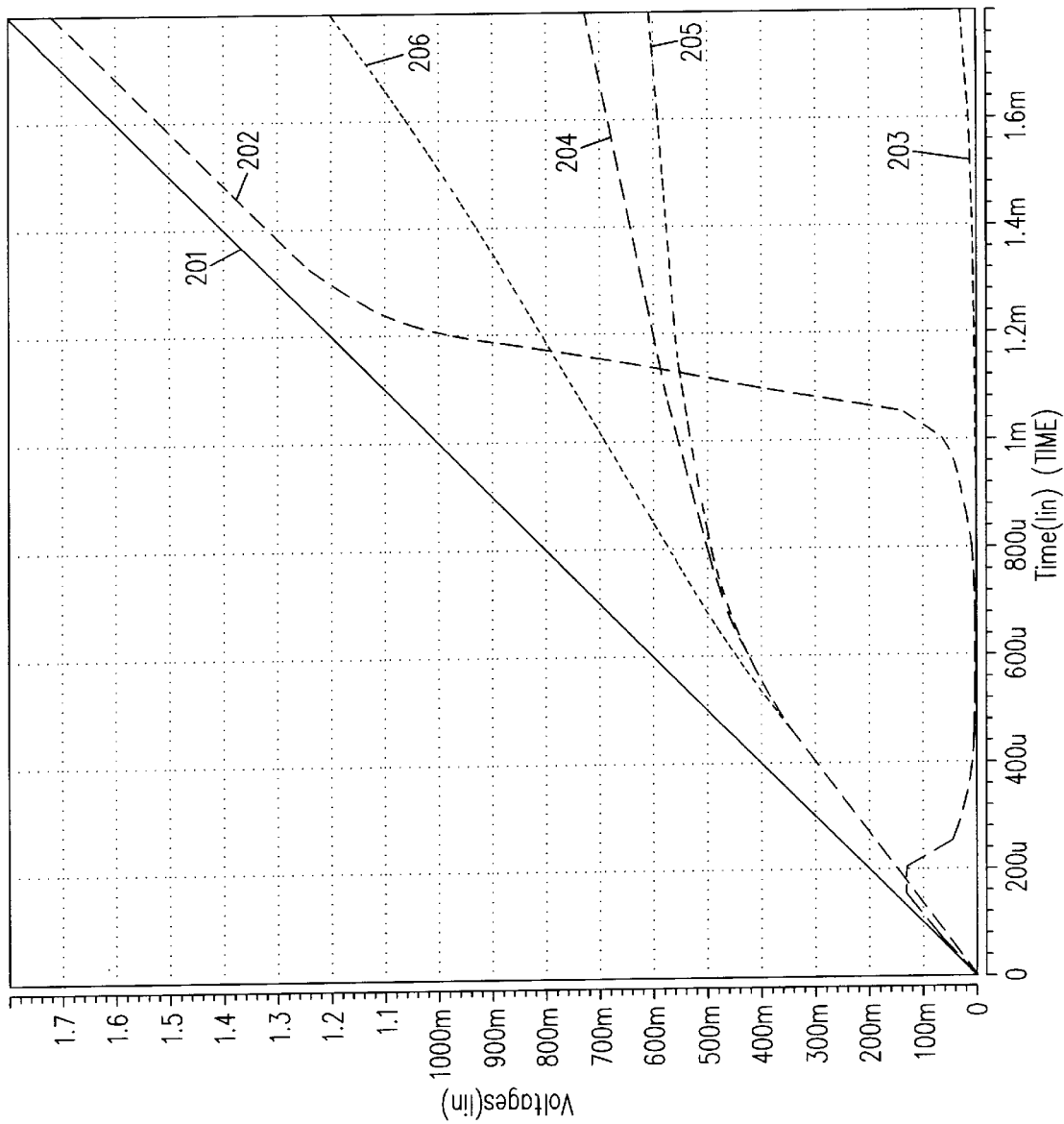
FIG. 2 is a graph of illustrating the operating characteristics of the polycide fuse of FIG. 1 in accordance with one embodiment of the present invention.

FIG. 2 is a graph illustrating the operating characteristics of polycide fuse 121 in accordance with one embodiment of the present invention. Line 201 illustrates the $V_{DD}$ supply voltage at start-up, which increases from 0 Volts to 1.8 Volts in a fairly linear manner. Line 202 illustrates the output voltage $D_0$ when the polycide fuse 121 is not programmed. As illustrated by line 202, if memory circuit 100 is not programmed, then the output voltage $D_o$ rises with the $V_{DD}$ supply voltage. Line 203 illustrates the output voltage $D_0$ when the polycide fuse 121 is programmed. As illustrated by line 203, if memory circuit 100 is programmed, then the output voltage $D_o$ stays at a voltage substantially equal to the $V_{Oss}$ supply voltage.

Line 204 illustrates the voltage on the drain of transistor 107. Because the reference current $I_{REF}$ is constant, the voltage on the drain of transistor 107 will follow the same line whether or not polycide fuse 121 is programmed.

Line 205 illustrates the voltage on the input terminal of inverter 112 when polycide fuse 121 is not programmed. This voltage remains below the threshold voltage of inverter 112 (which is about 0.9 Volts in the described embodiment), thereby causing inverter 112 to provide a logic high output (See, Line 202).

Line 206 illustrates the voltage on the input terminal of inverter 112 when polycide fuse 121 is programmed. This voltage exceeds the threshold voltage of inverter 112 (0.9 Volts), thereby causing inverter 112 to provide a logic low output (See, Line 203).

Figure 3:
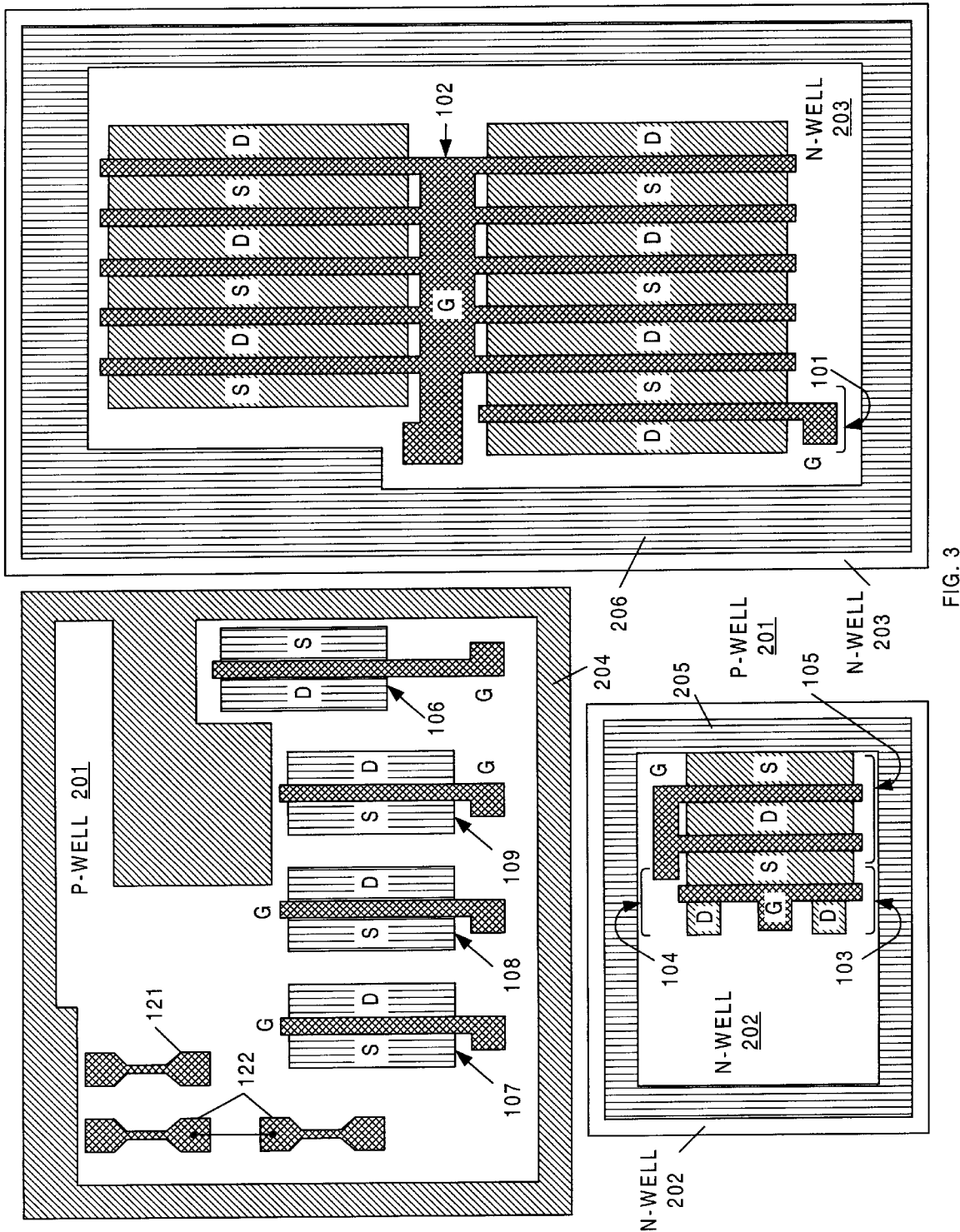
FIG. 3 is a layout diagram of the polycide fuse and access circuitry of FIG. 1 in accordance with one embodiment of the present invention.

FIG. 3 is a layout diagram of memory circuit 100 in accordance with one embodiment of the present invention. As illustrated in FIG. 3, memory circuit 100 is fabricated in a p-well 201, a low voltage n-well 202 and a high voltage n-well 203 of a monocrystalline silicon substrate. An n-type guard ring region 204 is formed in p-well 201, a p-type guard ring region 205 is formed in low voltage n-well 202, a p-type guard ring region 206 is formed in high voltage n-well 203. Polycide gate electrodes (G) corresponding with n-channel transistors 106–109 and polycide resistors 121–122 are formed over p-well 201 as illustrated in FIG. 3. Polycide gate electrodes (G) corresponding with low voltage p-channel transistors 103–105 are formed over low voltage n-well 202. Polycide gate electrodes (G) corresponding with high voltage p-channel transistors 101–102 are formed over high voltage n-well 203. Isolating transistors 101 and 102 in a separate well region enables these transistors to be operated in response to the higher $V_{IO}$ supply voltage.

N-wells 202 and 203 are masked and an n-type ion implant operation is performed to form the source regions (S) and the drain regions (D) of n-channel transistors 106–109 in p-well 201. Similarly, p-well 201 is masked and a p-type ion implant operation is performed to form the source regions (S) and the drain regions (D) of p-channel transistors 101–105 in n-well 202. Field oxide (not shown) is located outside of the active regions. An interconnect structure consisting of one or more conductive layers is formed over the structure of FIG. 3, thereby connecting the various circuit elements in the manner shown by FIG. 1. The manner of forming such an interconnect structure is known to one of ordinary skill in the art.

In accordance with one embodiment of the present invention, memory circuit 100 can be expanded to include arrays of programmable polycide fuses. In a particular application, these arrays are used as non-volatile storage on a field programmable gate array (FPGA).

Figure 4:
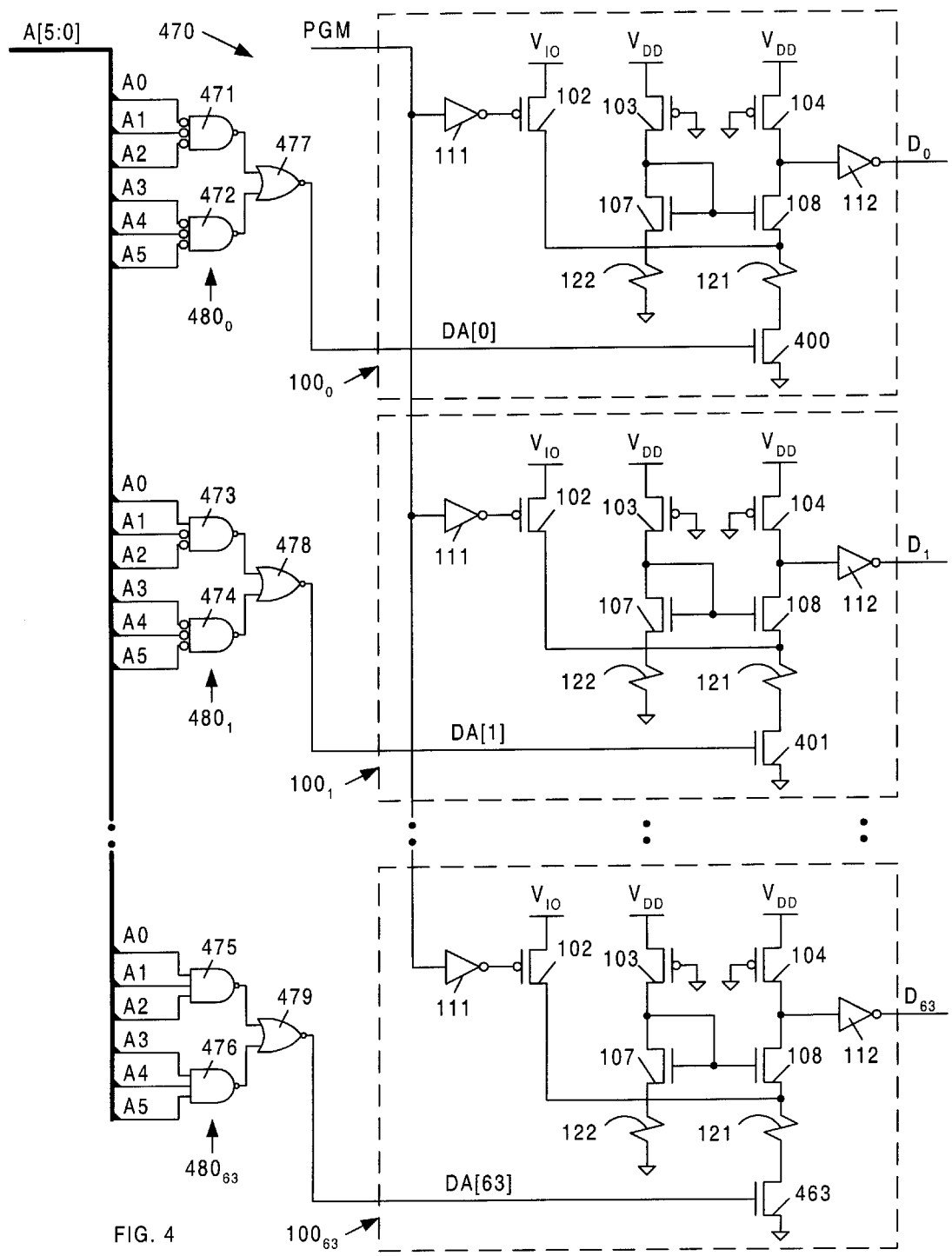
FIG. 4 is a circuit diagram of a decoder circuit in accordance with one embodiment of the present invention.

FIG. 4 is a schematic diagram of a memory system 470 arranged in a 64×1 array in accordance with another embodiment of the present invention. Memory system 470 includes sixty-four memory circuits $100_0$–$100_{63}$, and sixty-four corresponding address decoders $480_0$–$480_{63}$. Because each of memory circuits $100_0$–$100_{63}$ is similar to memory circuit 100, similar elements in memory circuits $100_0$–$100_{63}$ and memory circuit 100 are labeled with similar reference numbers. In addition to each of the above-described elements of memory circuit 100, memory circuits $100_0$–$100_{63}$ additionally include n-channel access transistors 400–463, respectively. These access transistors 400–463 are connected in series between the $V_{ss}$ supply terminal and the polycide resistor 121 in each of memory circuits $100_0$–$100_{63}$.

Each of memory circuits $100_0$–$100_{63}$ can only be programmed or read if the corresponding access transistor 400–463 is turned on. Access transistors 400–463 are sized to have a low resistance (i.e., a large width to length ratio W/L), because these transistors must pass the relatively large programming current of 5 mA. In the described embodiment, each of access transistors 400–463 has a width of 100 microns and a length of 0.25 microns.

Access transistors 400–463 are controlled by corresponding address decoders $480_0$–$480_{63}$, respectively. Address decoders $480_0$–$480_{63}$ assert decoded address signals DA[63:0], respectively, in response to the 6-bit address A[5:0]. For example, address decoder $480_0$ asserts the decoded address signal DA[0] when the address A[5:0] has a value of "000000".

In the described embodiment, each of address decoders $480_0$–$480_{63}$ includes a pair of NAND gates and a NOR gate. Thus, address decoder $480_0$ includes NAND gates 471–472 and NOR gate 477. Address decoder 480, includes NAND gates 473–474 and NOR gate 478. Address decoder $480_{63}$ includes NAND gates 475–476 and NOR gate 479. Within each of address decoders $480_0$–$480_{63}$, the NAND gates are provided with a unique pattern of inverting input terminals. For example, within address decoder $480_0$, all of the input terminals of NAND gates 471 and 472 are inverting input terminals. Within address decoder $480_1$, all of the input terminals of NAND gate 474, and the input terminals of NAND gate 473 that receive address signals A[2] and A[1] are inverting input terminals, while the input terminal of NAND gate 473 that receives address signal A[0] is not an inverting input terminal. As a result, address decoder $480_1$ asserts the decoded address signal DA[1] when the address A[5:0] has a value of "000001". A binary pattern of inverting input terminals continues for the remaining address decoders. Note that none of the input terminals of NAND gates 475–476 are inverting input terminals. As a result, address decoder $480_{63}$ asserts the decoded address signal DA[63] when the address A[5:0] has a value of "11111".

Memory system 470 can be easily expanded to have other dimensions in other embodiments of the invention. In one application, memory system 470 is used to store a key value of a decoder/encoder system of an FPGA.

Figure 5:
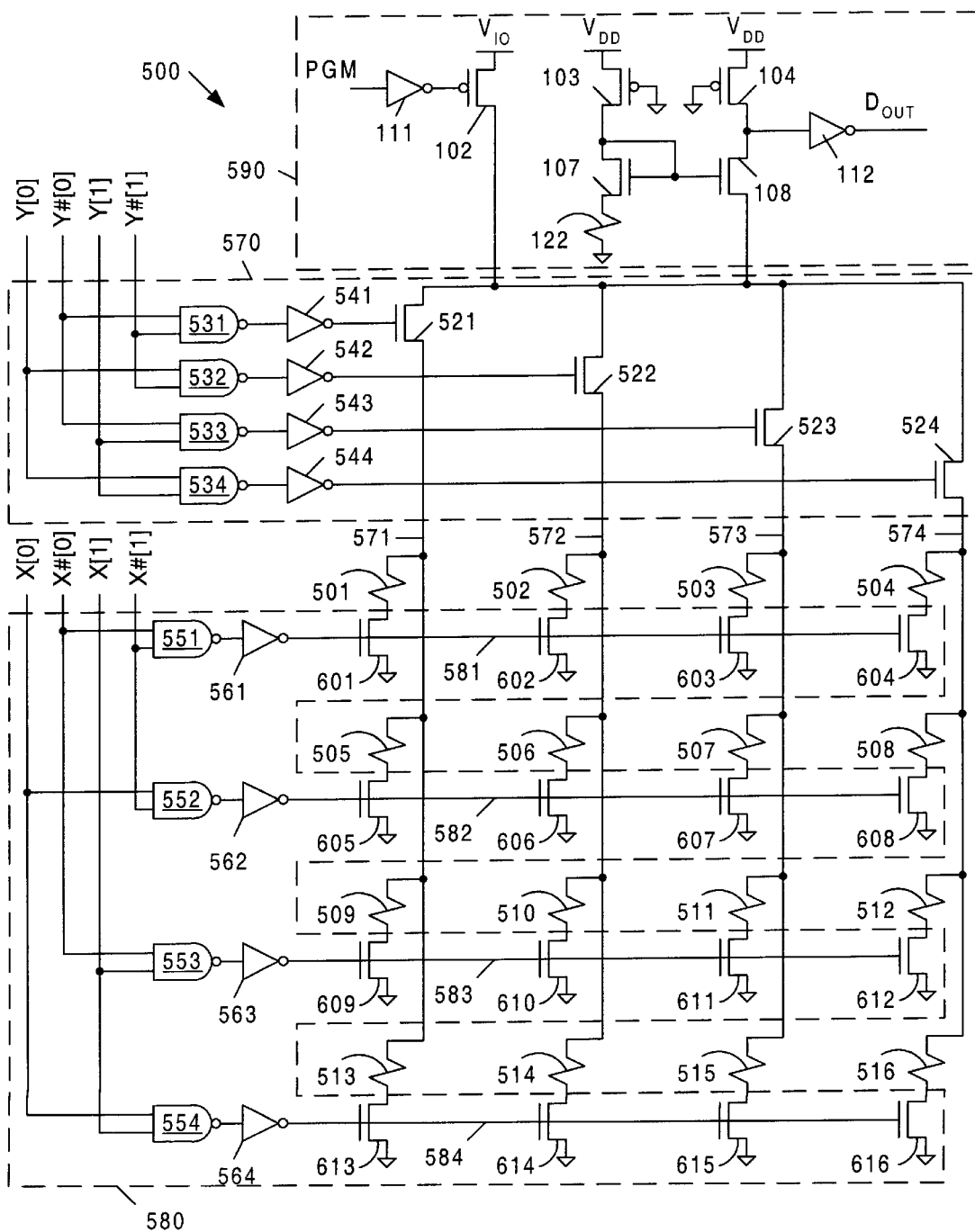
FIG. 5 is a circuit diagram of a 4×4 array of one-time programmable polycide fuses in accordance with one embodiment of the present invention.

FIG. 5 is a block diagram of a memory system 500 in accordance with another embodiment of the present invention. Memory system 500 includes a 4×4 array of polycide fuses 501–516, column decoder circuit 570, bit lines 571–574, row decoder circuit 580 and access control circuit 590. Each of the polycide fuses 501–516 is identical to polycide fuse 121 (FIGS. 1 and 4). Each column of polycide fuses is connected to a corresponding bit line. Although the present invention is described as a 4×4 array, it is understood that arrays having other dimensions can be constructed in accordance with the teachings of the present specification.

Because access control circuit 590 is similar to memory circuit 100 (FIG. 1), similar elements in FIGS. 1 and 5 are labeled with similar reference numbers. Thus, access control circuit 590 includes p-channel transistors 102–104, n-channel transistors 107–108, inverters 111–112 and polycide resistor 122. In general, the remaining circuitry of memory system 500 is used to selectively couple one of the polycide fuses 501–516 between the source of n-channel transistor 108 and the $V_{ss}$ supply terminal. Once connected in this manner, the state of the selected polycide fuse can be programmed or read in the manner described above for memory systems 100 and 400. Access control circuit 590 includes a partial sense amplifier circuit that includes transistors 103–104, 107–108 and resistor 122. This partial sense amplifier circuit is completed, thereby forming a sense amplifier circuit, when the column and row decoder circuits 570 and 580 selectively couple one of the polycide fuses 501–516 to the source of transistor 108.

Column decoder 570 selectively couples one of the bit lines 571–574 to the source of n-channel transistor 108 in response to the address signals Y[1:0] and Y#[1:0]. As used herein, the "#" symbol identifies a complementary (inverse) signal. Column decoder 570 includes bit line access transistors 521–524, NAND gates 531–534 and inverters 541–544. In the described embodiment, each of access transistors 521–524 is a high voltage transistor having a width of 100 microns and a length of 0.25 microns. Each of bit line access transistors 521–524 is connected in series between the source of n-channel transistor 108 and a corresponding bit line 571–574. NAND gates 531–534 and inverters 541–544 are configured to turn on bit line access transistors 521, 522, 523 and 524, when the address signals Y[1:0] has values of "00", "01", "10" and "11", respectively.

Row decoder 580 includes NAND gates 551–554, inverters 561–564, word lines 581–584, and access transistors 601–616. Row decoder 580 selectively applies a logic high signal to one of the word lines 581–584 in response to the address signals X[1:0] and X#[1:0]. Access transistors 601–616 are connected between polycide fuses 501–516, respectively, and the $V_{ss}$ supply terminal. In the described embodiment, each of access transistors 601–616 is identical to access transistor 400 (FIG. 4).

Each of the word lines 581–584 is connected to the access transistors in a corresponding row of the array. Thus, word lines 581, 582, 583 and 584 are connected to access transistors 601–604, 605–608, 609–612 and 613–616, respectively. NAND gates 551–554 and inverters 561–564 are configured to apply a logic high signal to word lines 581, 582, 583 and 584, when the address signals X[1:0] have values of "00", "01", "10" and "11", respectively.

To access polycide fuse 507, address signals X[1:0] and Y[1:0] having values of "01" and "10", respectively are applied to column decoder 570 and row decoder 580. In response, inverter 543 applies a logic high signal to transistor 523, thereby turning on this transistor. Under these conditions, inverters 541–542 and 544 provide logic low signals to bit line access transistors 521–522 and 524, thereby turning off these transistors. In addition, inverter 562 applies a logic high signal to word line 582, thereby turning on transistors 605–608. Inverters 561 and 563–564 apply logic low signals to word lines 581 and 583–584, thereby turning off transistors 601–604 and 609–616. Turned on transistors 523 and 607 couple polycide fuse 507 between the $V_{ss}$ supply terminal and the source of transistor 108. At this time, the state of polycide fuse 507 can be programmed or read in the manner described above.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A non-volatile memory system comprising:
   a plurality of memory circuits, wherein each of the memory circuits includes:
   a sense amplifier circuit that includes a polycide fuse element;
   a first access transistor for enabling the sense amplifier circuit, the first access transistor being connected in series with the polycide fuse element; and
   a second access transistor for applying a programming voltage to the polycide fuse element, the second access transistor being connected in series with the polycide fuse element; and
   a decoder circuit coupled to the first access transistor in each of the memory circuits, wherein the decoder circuit is configured to selectively enable one of the first access transistors in response to an address signal.

2. The memory system of claim 1, wherein the memory system is fabricated on a chip having core logic that is powered by a $V_{DD}$ supply voltage and input/output logic that is powered by a $V_{IO}$ supply voltage, the $V_{IO}$ supply voltage being greater than the $V_{DD}$ supply voltage, wherein the $V_{IO}$ supply voltage is used as the programming voltage.

3. The memory system of claim 1, wherein the second access transistor in each of the memory circuits is commonly connected to receive a programming control signal.

4. The memory system of claim 1, wherein each sense amplifier circuit further comprises a first set of series-connected transistors and a second set of series-connected transistors.

5. The memory system of claim 4, wherein each sense amplifier circuit further comprises the polycide fuse element and the first access transistor connected in series with the first set of series-connected transistors, and a resistor connected in series with the second set of series-connected transistors, wherein the resistor has a greater resistance than the polycide fuse element before the polycide fuse element is programmed, and wherein the resistor has a lower resistance than the polycide fuse element after the polycide fuse element is programmed.

6. The memory system of claim 1, wherein each first access transistor is a high-voltage transistor.

7. The memory system of claim 1, wherein each second access transistor is a high-voltage transistor.

8. A memory system comprising:
   an array of polycide fuse elements arranged in at least one row and a plurality of columns;
   an access control circuit for individually reading and programming each of the polycide fuse elements;
   a plurality of bit lines, wherein each of the columns of polycide fuse elements is connected to a corresponding one of the bit lines;
   a column decoder circuit configured to selectively couple one of the bit lines to the access control circuit in response to an address signal; and a row decoder circuit configured to selectively couple the polycide fuse elements in a row of the array between the corresponding one of the bit lines and a voltage supply terminal in response to an address signal.

9. The memory system of claim 8, wherein the access control circuit comprises:
a partial sense amplifier circuit, wherein the partial sense amplifier circuit is completed by connection to one of the polycide fuse elements; and
a programming transistor coupled to receive a programming voltage.

10. The memory system of claim 9, wherein the column decoder circuit is configured to selectively couple one of the bit lines to the partial sense amplifier circuit and the programming transistor in response to an address signal.

11. The memory system of claim 9, wherein the partial sense amplifier circuit comprises a first set of series connected transistors and a second set of series-connected transistors.

12. The memory system of claim 11, wherein the partial sense amplifier circuit further comprises a resistor connected in series with the second set of series-connected transistors, wherein the resistor has a greater resistance than each of the polycide fuse elements before the polycide fuse elements are programmed, and wherein the resistor has a lower resistance than the polycide fuse elements after the polycide fuse elements are programmed.

13. The memory system of claim 12, wherein the first set of series-connected transistors is connected to the column decoder circuit.

14. The memory system of claim 8, wherein the column decoder circuit comprises a plurality of access transistors, wherein each of the access transistors is connected between the access control circuit and a corresponding one of the bit lines.

15. The memory system of claim 8, wherein the row decoder circuit comprises a plurality of access transistors, wherein each of the access transistors is connected in series with a corresponding one of the polycide fuse elements.

16. A one-time programmable memory circuit fabricated on a chip, the memory circuit comprising:
a $V_{DD}$ supply terminal configured to supply a $V_{DD}$ supply voltage to core logic on the chip;
a $V_{IO}$ supply terminal configured to provide a $V_{IO}$ supply voltage to input/output logic on the chip, wherein the $V_{IO}$ supply voltage is greater than the $V_{DD}$ supply voltage;
a polycide fuse; and
an access control circuit for programming and reading the polycide fuse, the access control circuit being configured to couple the $V_{IO}$ supply terminal to the polycide fuse during programming, the access control circuit further being configured to couple the $V_{DD}$ supply terminal to the polycide fuse during reading.

17. The one-time programmable memory circuit of claim 16, wherein the access control circuit comprises a high voltage transistor coupled between the $V_{IO}$ supply terminal and the polycide fuse.

18. The one-time programmable memory circuit of claim 16, wherein the access control circuit comprises a sense amplifier circuit.

19. A method of accessing an array of polycide fuses arranged in at least one row and a plurality of columns, the method comprising the steps of:
selectively coupling one of the columns of polycide fuses to a partial sense amplifier circuit and a programming transistor in response to an address signal; and
selectively coupling each of the polycide fuses in a row to a voltage supply terminal in response to an address signal.

* * * * *